United States Patent [19]

Arcoleo et al.

[11] Patent Number: 5,852,579
[45] Date of Patent: Dec. 22, 1998

[54] METHOD AND CIRCUIT FOR PREVENTING AND/OR INHIBITING CONTENTION IN A SYSTEM EMPLOYING A RANDOM ACCESS MEMORY

[75] Inventors: Mathew R. Arcoleo, San Jose; Raymond M. Leong, Los Altos; Derek Johnson, Los Gatos, all of Calif.; Jonathan F. Churchill, Berkshire, United Kingdom

[73] Assignee: Cypress Semiconductor Corporation, San Jose, Calif.

[21] Appl. No.: 878,904

[22] Filed: Jun. 19, 1997

[51] Int. Cl.[6] ............................ G11C 7/00; H03K 19/003
[52] U.S. Cl. ........................ 365/189.05; 326/27; 326/87
[58] Field of Search ................. 365/230.06, 189.05; 326/26, 27, 83, 87, 86; 327/108, 379, 380

[56] References Cited

U.S. PATENT DOCUMENTS

| | | | |
|---|---|---|---|
| 4,820,942 | 4/1989 | Chan | 327/310 |
| 5,063,308 | 11/1991 | Borkar | 326/27 X |
| 5,471,150 | 11/1995 | Jung | 326/87 |
| 5,517,129 | 5/1996 | Kaplinsky | 326/27 |
| 5,708,386 | 1/1998 | Chow | 327/380 |

*Primary Examiner*—Son Mai
*Attorney, Agent, or Firm*—Blakely, Sokoloff, Taylor & Zafman

[57] ABSTRACT

A Static Random Access Memory (SRAM) comprises an input/output pin and driver means connected to the input/output pin. The driver means are configured to drive the input/output pin to a voltage potential using a first current, and are further configured to hold the input/output pin at approximately the voltage potential using a second current. In one embodiment, the driver means may comprise a driver unit for driving the input/output pin to the voltage potential, a bus hold circuit for holding the input/output pin at the voltage potential and a control unit connected to the driver unit and the bus hold circuit. The control unit may activate and deactivate the driver unit and the bus hold circuit.

19 Claims, 5 Drawing Sheets

5,852,579

METHOD AND CIRCUIT FOR PREVENTING AND/OR INHIBITING CONTENTION IN A SYSTEM EMPLOYING A RANDOM ACCESS MEMORY

FIELD OF THE INVENTION

The present invention relates generally to the field of Static Random Access Memories (SRAMs), and more specifically to reducing or eliminating bus contention in systems employing SRAMs.

BACKGROUND

Systems employing Static Random Access Memories (SRAMs) often require the SRAM to drive a data bus quickly in order to meet various device and/or timing specifications. To meet these requirements, SRAMs are typically equipped with output drivers that have high signal switching strengths. FIG. 1 illustrates such an output driver 5 as may be found in conventional SRAMs.

Output driver 5 includes an NMOS transistor (N1) and a PMOS transistor (P1). The source of transistor P1 is coupled to Vcc, while the drain is coupled to an input/output (I/O) pin 30. The drain of transistor N1 is also coupled to I/O pin 30, while the source is coupled to ground. Transistors N1 and P1 are configured to have high drive strengths (i.e., the transistors are capable of conducting a large amount of current) so that I/O pin 30 is driven to a voltage potential (e.g., high or low) quickly in order to meet READ timing specifications. If the signal (e.g., a data signal to be transmitted from the SRAM) received at the interconnected gates of transistors N1 and P1 is a logic 0, P1 is activated and N1 is disabled, resulting in I/O pin 30 being quickly driven high to a logic 1. If the signal received at the interconnected gates of N1 and P1 is a logic 1, transistor N1 is activated and P1 is disabled, resulting in I/O pin 30 being quickly driven low to a logic 0.

Potential problems may arise, however, while operating with output drivers, such as output driver 5, that have high drive strengths. For example, if contention occurs (i.e., if two devices attempt to drive a common node, e.g., a node which is connected to I/O pin 30, to different logic levels), each driving device will sink or source a large amount of current in an attempt to drive the node to a corresponding voltage potential (0 or 1). When such bus contention occurs, it may cause the appearance of a momentary short circuit between Vcc and ground. This may, in turn, cause excessive noise on the bus, and may also lead to SRAM and/or system failure.

Bus contention is a major concern in common input/output devices, such as SRAMs, that use the same pin as both an input and an output. Bus contention may occur when such a device makes a transition from a READ to WRITE operation, or vice versa. FIG. 2 is a timing diagram illustrating switching waveforms at I/O pin 30 when being driven by output driver 5 during a READ cycle and when being driven by a device external to the SRAM during a WRITE cycle.

At time $t_0$, an external device is driving I/O pin 30 during write operations to the SRAM. At time $t_1$, a new clock cycle begins and the rising edge of the new clock cycle may signal the end of the WRITE cycle and the beginning of a READ cycle. The external device recognizes the rising edge of the clock signal (CLK) and will begin to disable its output driver accordingly. That is, the external device recognizes the rising edge at time $t_1$, as the end of the WRITE cycle. However, due to some propagation and other delays, the external device may not actually be able to place I/O pin 30 in a 3-stated condition until time $t_3$. Similarly, the memory device controlling output driver 5 recognizes the rising edge of the clock signal at time $t_1$ as the beginning of the READ cycle. However, due to internal delays within the memory device associated with output driver 5, output driver 5 starts driving a voltage onto I/O pin 30 only at time $t_2$. It is apparent that between times $t_2$ and $t_3$, both output driver 5 and the external device may be driving a voltage onto I/O pin 30, causing a bus contention situation.

One method that is commonly used to prevent bus contention is to add an additional clock cycle between consecutive read and write cycles. FIG. 3 is a timing diagram illustrating the use of such additional or "dead" cycles. At time $t_0$ the external device is driving I/O pin 30. At time $t_1$ the next clock cycle begins. The external device recognizes the rising edge of the clock signal CLK at time t, as the end of the WRITE cycle and stops driving a voltage onto I/O pin 30 at time $t_2$. The SRAM associated with driver 5 also recognized, at time $t_1$, that the WRITE cycle was terminated. In order to avoid bus contention, it delays the start of the READ cycle until the beginning of the next clock cycle at time $t_3$. However, due to the SRAM's internal delays, I/O pin 30 is not driven until time $t_4$. The clock cycle between times $t_1$ and $t_3$ serves as the "dead" cycle to accommodate the changeover from a WRITE cycle to a READ cycle. The external device uses this clock cycle to turn off its drivers. Although this method prevents bus contention, it hinders system performance by adding a wait state (i.e., "dead" cycle) each time a different device is to drive I/O pin 30.

Yet another method of preventing bus contention is to exercise very close control over the output enable signals of the driving devices. If configured properly, this allows a driving device controlling I/O pin 30 to deassert its output driver before a subsequent device is activated. However, clock specifications and clock skew between various devices connected to a common bus may render this solution difficult to implement.

SUMMARY OF THE INVENTION

A Static Random Access Memory (SRAM) comprises an input/output pin and driver means connected to the input/output pin. The driver means are configured to drive the input/output pin to a voltage potential using a first current, and are further configured to hold the input/output pin at approximately the voltage potential using a second, smaller current. In one embodiment, the driver means may comprise a driver unit for driving the input/output pin to the voltage potential, a bus hold circuit for holding the input/output pin at the voltage potential and a control unit connected to the driver unit and the bus hold circuit. The control unit may activate and deactivate the driver unit and the bus hold circuit.

BRIEF DESCRIPTION OF THE DRAWINGS

The present invention is illustrated by way of example and not limitation in the figures of the accompanying drawings in which.

DETAILED DESCRIPTION

According to the present invention an SRAM includes an output driver that drives an input/output pin with high current drive transistors and a bus hold circuit. Upon being signaled to drive the input/output pin, the output driver activates the high current drive transistors and the bus hold circuit. The high drive current transistors remain active until the input/output bus is switched to the desired voltage potential. Once at the desired voltage potential, the high drive current transistors are deactivated and the bus hold circuit holds the input/output pin at approximately the voltage potential with a smaller amount of current than was used by the high current drive transistors. After reviewing this specification, it will be apparent to those skilled in the art that the present invention may be practiced without some or all of the specific details disclosed herein. In other instances, well known circuit designs and techniques have not been described in detail in order not to unnecessarily obscure the present invention.

Figure 1:
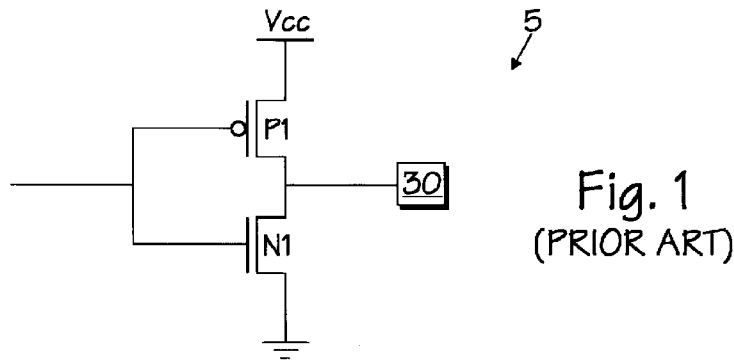
FIG. 1 illustrates a conventional output driver.
Figure 2:
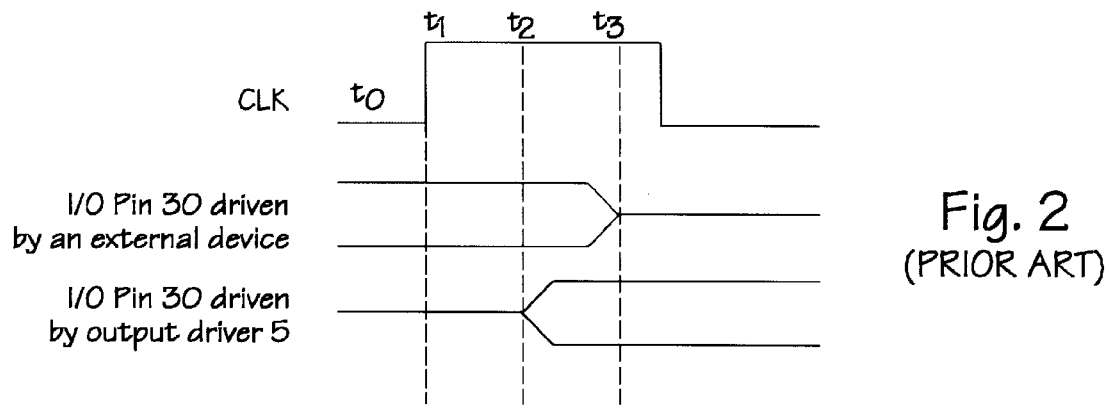
FIG. 2 is a timing diagram illustrating bus contention which may be experienced with the conventional output driver of FIG. 1.
Figure 3:
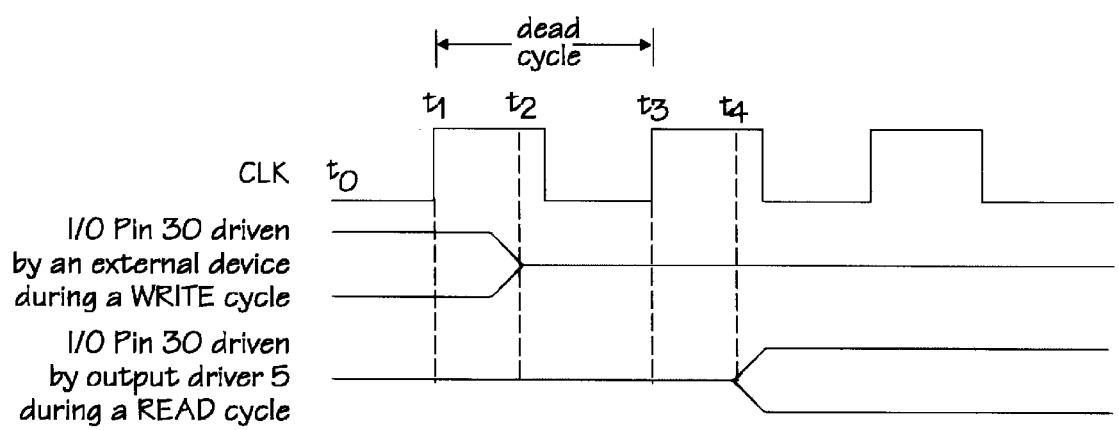
FIG. 3 is a timing diagram illustrating the use of a "dead" cycle to overcome the bus contention problems illustrated in FIG. 2.
Figure 4:
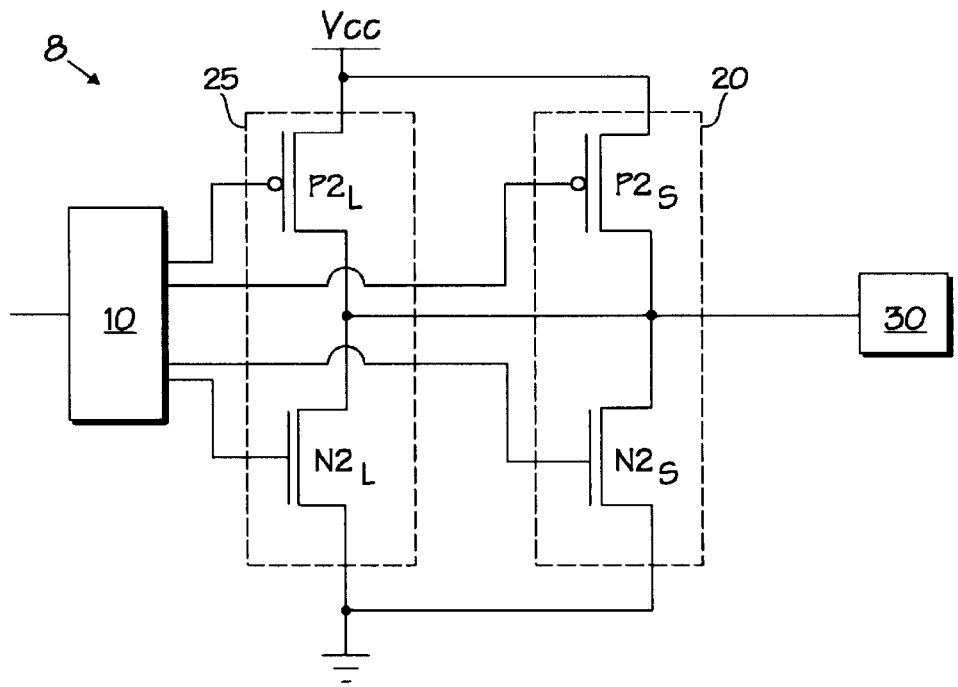
FIG. 4 illustrates an output driver according to one embodiment of the present invention.

Referring to FIG. 4, an output driver 8 according to one embodiment of the present invention is illustrated. Preferably, output driver 8 is contained within a synchronous SRAM. However, one of ordinary skill in the art will recognize that output driver 8 may be included in all types of SRAMs (e.g., asynchronous, synchronous pipelined, etc.). Output driver 8 includes a control unit 10, a bus hold circuit 20, a driver circuit 25, and an input/output (I/O) pin 30. Driver circuit 25 includes an NMOS transistor ($N2_L$) and a PMOS transistor ($P2_L$). Control unit 10 is coupled to the gates of transistors $N2_L$ and $P2_L$. The source of $P2_L$ is coupled to Vcc, while the drain is coupled to I/O pin 30. The drain of $N2_L$ is coupled to I/O pin 30, while the source is coupled to ground. Transistors $N2_L$ and $P2_L$ are configured to have high drive strengths so that I/O pin 30 is driven to a voltage potential quickly in order to meet READ cycle timing specifications. I/O pin 30 may be coupled to a bus which may follow the potential applied to I/O pin 30 by output driver 8.

Bus hold circuit 20 includes an NMOS transistor ($N2_S$) and a PMOS transistor ($P2_S$). The gates of transistors $N2_S$ and $P2_S$ are coupled to control unit 10. The source of $P2_S$ is coupled to Vcc, while the drain is coupled to I/O pin 30. The drain of $N2_S$ is coupled to I/O pin 30, while the source is coupled to ground. Transistors $N2_S$ and $P2_S$ included in bus hold circuit 20 are configured to have low drive strengths relative to $N2_L$ and $P2_L$. In an alternative embodiment of the present invention, transistors $N2_L$, $P2_L$, $N2_S$ and $P2_S$ are variable strength drivers. Thus, output driver 8 may be configured such that various transistor drive strengths may be selected, enabling a user to "tune" output driver 8.

Figure 7:
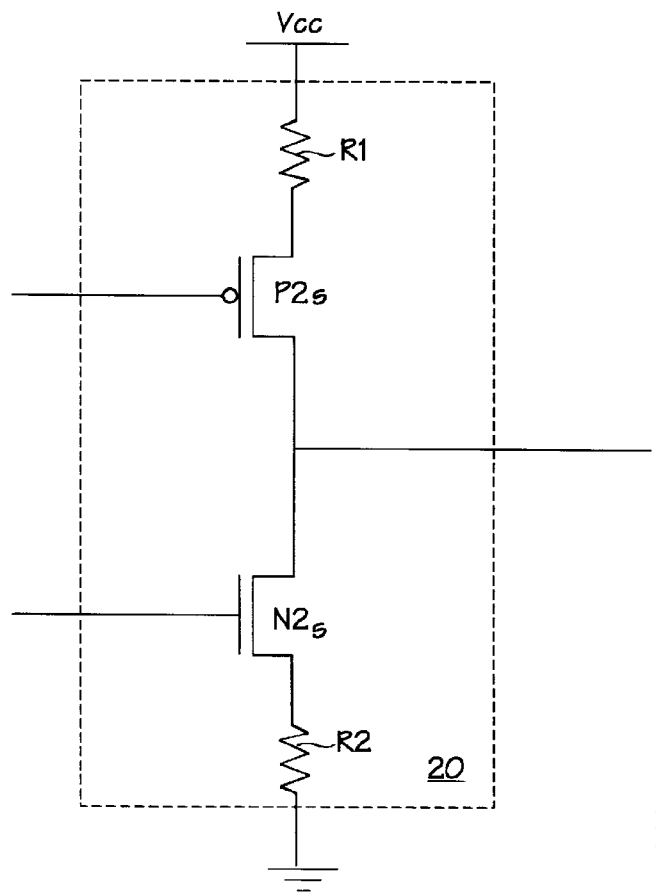
FIG. 7 illustrates an alternative embodiment of a bus hold circuit according to the present invention.

FIG. 7 illustrates an alternative embodiment of bus hold circuit 20. In this embodiment, a resistor R1 is coupled to VCC and the source of transistor $P2_S$. A resistor R2 is coupled to ground and the source of transistor $N2_S$. Resistors R1 and R2 are configured to dissipate the current sourced from bus hold circuit 20. Accordingly, the drive from bus hold circuit 20 is low relative to that of driver circuit 25.

Returning to FIG. 4, for this example control unit 10 may receive a signal from logic circuits within the SRAM (not pictured) to drive I/O pin 30. If the signal received is a logic 0, control unit 10 transmits a logic 0 to driver circuit 25 and bus hold circuit 20. Consequently, transistor $P2_L$ of driver circuit 25 and transistor $P2_S$ of bus hold circuit 20 are activated while transistor $N2_L$ of driver circuit 25 and transistor $N2_S$ of bus hold circuit 20 are disabled, resulting in I/O pin 30 being quickly driven to a high voltage potential (logic 1) with a large current. According to the present embodiment, control unit 10 is configured to "shut off" or disable transistor $P2_L$ after a predetermined period of time. The predetermined time may be calculated by an internal timer within control unit 10 that is activated when control unit 10 receives the signal from the logic circuits, and operates according to some fraction or multiple of the system clock frequency. The timing out of the timer may occur after a period of time required for I/O pin 30 to switch from a 3-stated level to the operating voltage potential (e.g., logic 0 or 1). In the above case, once I/O pin 30 reaches the operating voltage potential (i.e., logic 1), control unit 10 commands transistor $P2_L$ to shut off. Because control unit 10 continues to transmit a logic 0 to bus hold circuit 20. Transistor $P2_S$ holds I/O pin 30 at approximately the high voltage potential with a relatively small amount of current.

Similarly, if the signal received at control unit 10 is a logic 1, a logic 1 is transmitted to driver circuit 25 and bus hold circuit 20. Transistors $N2_L$ and $N2_S$ are thus activated with transistors $P2_L$ and $P2_S$ disabled, resulting in I/O pin 30 being quickly driven to a low voltage potential (logic 0). Subsequent to I/O pin 30 being driven low, control unit 10 disables transistor $N2_L$ after the internal timer times out. Transistor $N2_S$ holds I/O pin 30 at approximately the low voltage potential, because control unit 10 continues to transmit a logic 1 to bus hold circuit 20.

In an alternative embodiment, output driver 8 may be configured so that the timer function and bus hold function are selectable (i.e., may be enabled or disabled by the user) by asserting a pin on the SRAM. This function would permit output driver 8 to operate by using only driver circuit 25 to drive I/O pin 30 when bus contention situations are not likely to arise.

Figure 5:
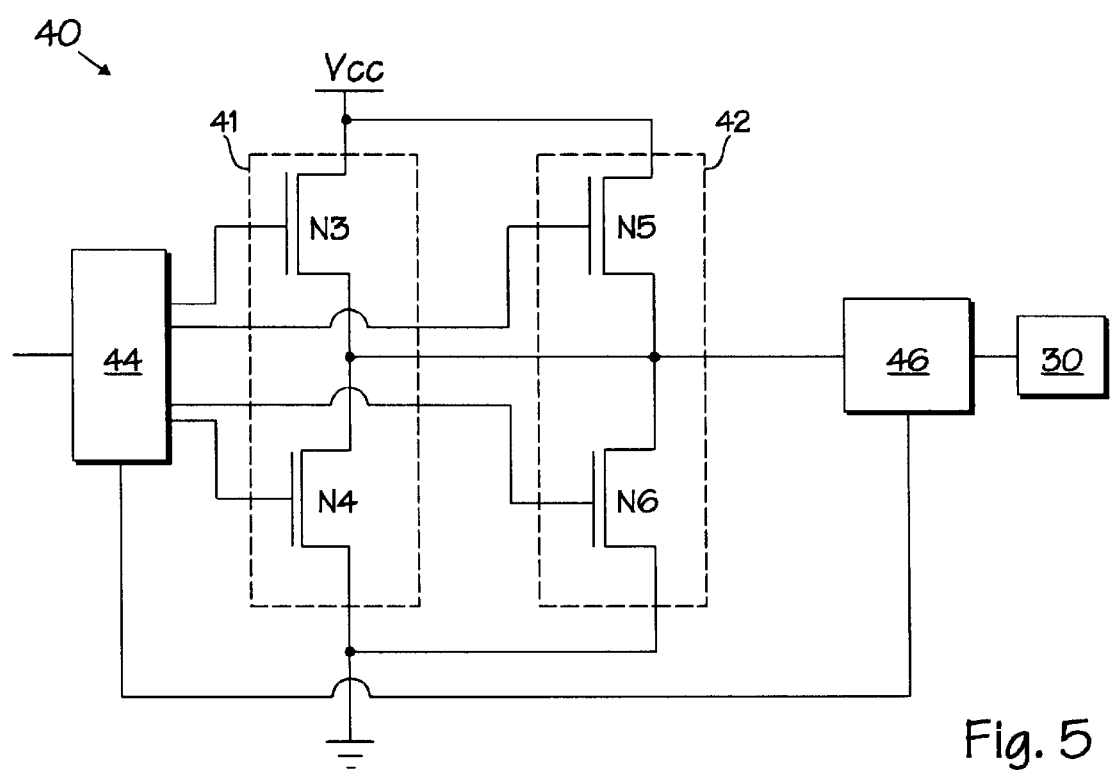
FIG. 5 illustrates an alternative embodiment of an output driver in accordance with a further embodiment of the present invention.

FIG. 5 illustrates yet another embodiment of the present invention. Output driver 40 includes driver unit 41, control unit 44, bus hold circuit 42, I/O pin 30, and a feedback unit 46 coupled to I/O pin 30. This time, the output driver includes four NMOS transistors N3–N6. Both transistors N3 and N4 are configured to have high drive strengths. Transistors N5 and N6 are configured to have low drive strengths relative to N3 and N4. Feedback unit 46 may be configured to sense the current being sourced or sinked to I/O pin 30 as it is being driven by driver circuit 41. Alternatively, feedback unit 46 may sense the voltage at I/O pin 30.

In operation, control unit 44 receives a signal from logic circuits within the SRAM to drive I/O pin 30. If the signal received is a logic 0, control unit 44 transmits a logic 1 to transistor N3. The inputs to transistors N4, N5 and N6 are off. Consequently, transistor N3 is activated, resulting in I/O pin 30 being quickly driven high to a logic 1. Feedback unit 46 measures the current being delivered to I/O pin 30 as it is being driven by transistor N3. Once feedback unit 46 measures a threshold current that is sufficient to drive I/O pin 30 to the high voltage potential, a feedback signal is transmitted to control unit 44. Upon receiving the feedback signal, control unit 44 transmits a logic 1 to transistor N5 of bus hold circuit 20, and turns transistor N3 off. Transistor N5 is activated, resulting in I/O pin 30 being held at approximately the high voltage potential with a relatively small current.

Likewise, if the signal received at control unit 44 is a logic 0, a logic 1 is transmitted to transistor N4. The inputs to transistors N3, N5, and N6 are left off. Transistors N4 is activated, resulting in I/O pin 30 being quickly driven to low to a logic 0.

Upon I/O pin 30 being driven to the low voltage potential, feedback unit 46 transmits a feedback signal to control unit 44. Control unit 44, in turn, transmits a logic 1 to transistor N6 of bus hold circuit 42, and turns transistor N4 off. Transistor N6 is switched on and holds I/O pin 30 at the low voltage potential. In an alternative embodiment, output driver 40 may be configured so that the feedback and bus hold functions can be enabled by asserting a pin on the SRAM as described above.

One of ordinary skill in the art will recognize that transistors N3–N6 of output driver 40 could be replaced with four PMOS transistors to achieve the same results. In addition, the timing function of control unit 44, for deactivating the large transistors after I/O pin 30 is driven high or low, and the method using feedback unit 44 are interchangeable in all embodiments of the present invention.

Figure 6:
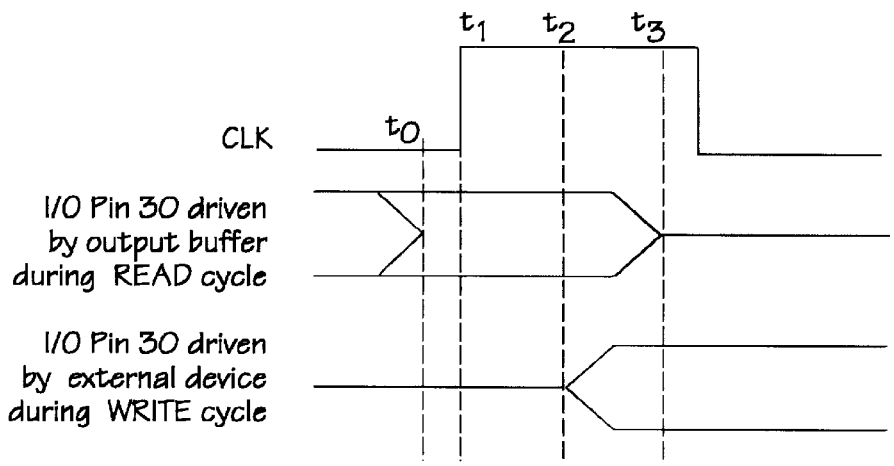
FIG. 6 is a timing diagram illustrating bus cycles which may be experienced using an output driver configured in accordance with the present invention.

FIG. 6 is a timing diagram illustrating bus cycles which may be experienced at I/O pin 30 during a READ cycle and a WRITE cycle. I/O pin 30 is driven by the SRAM circuits during a READ cycle. During a WRITE cycle, I/O pin 30 is driven by a device external to the SRAM. At time $t_0$, output driver 8 is driving I/O pin 30. At time $t_1$, the next clock cycle begins. The external device recognizes the rising edge of clock signal CLK at time $t_1$ as the beginning of the WRITE cycle. However, due to some propagation and other delays, the external device will not actually drive I/O pin 30 with a voltage potential until time $t_2$. Similarly, output driver 8 recognizes the rising edge of the clock signal CLK at time $t_1$ as the end of the READ cycle. Due to internal delays within the memory device, output driver 8 will not stop driving a voltage onto I/O pin 30 until time $t_3$ (at which time output driver 8 is placed in a 3-stated condition). However, by time $t_2$, output driver 8 has already reduced the desired voltage potential (logic 0 or logic 1) for the READ cycle. Thus, the high current drive transistors are disabled (i.e., the control inputs to transistors $P2_L$ and $N2_L$ are off). Only the bus hold circuit 20 is driving I/O pin 30 to the desired voltage potential with its low current driver transistors until the READ cycle is completed at time $t_3$. Output buffer 8 is placed in a 3-stated condition at time $t_3$ because the READ cycle is completed. Between times $t_2$ and $t_3$, both output driver 8 and the external device are active, causing a bus contention situation. Nevertheless, bus contention is no longer a major concern since the amount of current drawn by I/O pin 30 has been greatly reduced by deactivating the high current drive transistors of output driver 8. Accordingly, during a bus contention situation in the SRAM, the amount of current and related noise is limited to acceptable levels.

Figure 8:
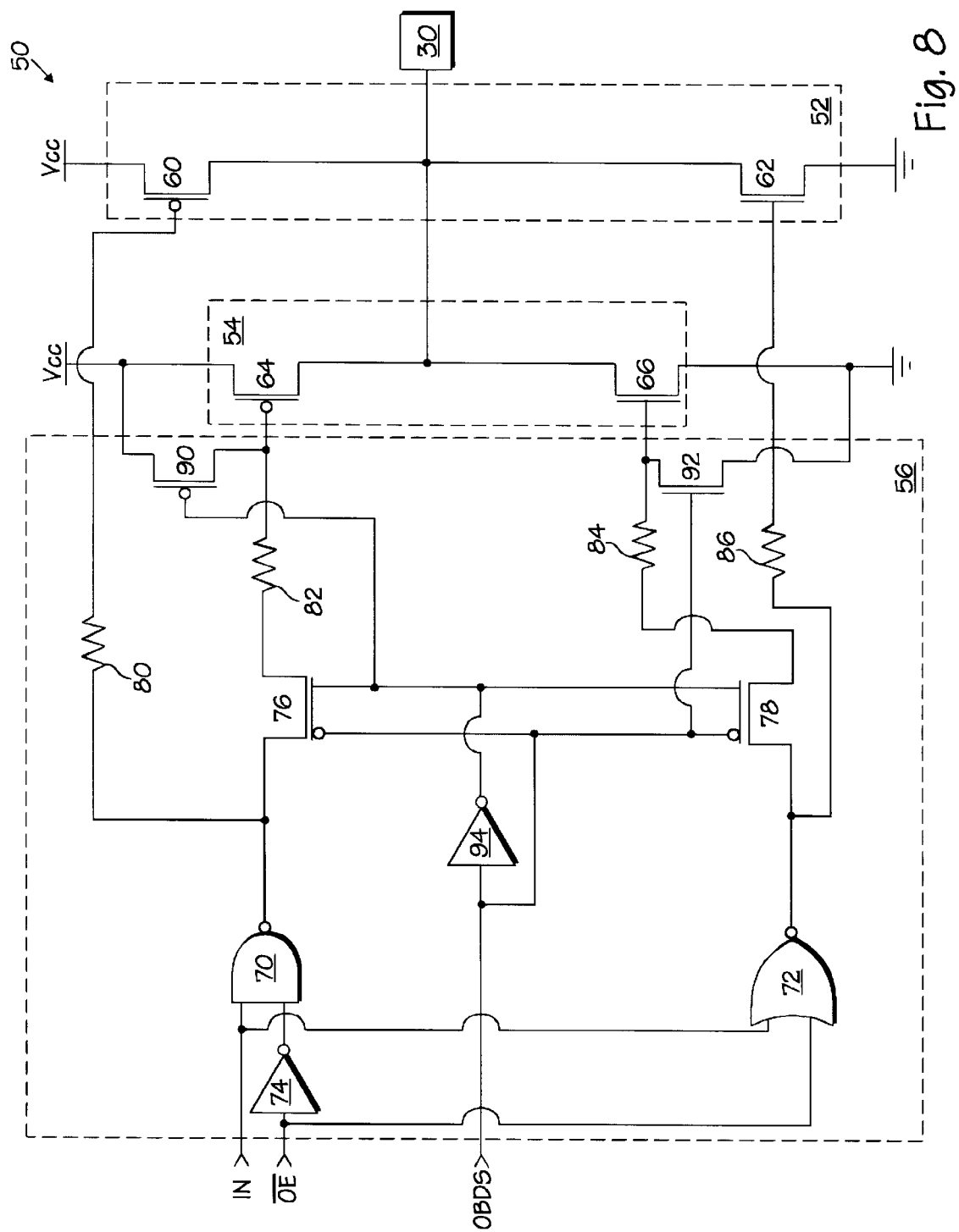
FIG. 8 illustrates one embodiment of a control unit for use with an output driver in accordance with the present invention.

FIG. 8 illustrates an output driver 50 configured in accordance with another embodiment of the present invention. Output driver 50 includes bus hold circuit 52, driver circuit 54 and control unit 56. For this embodiment, bus hold circuit 52 includes PMOS transistor 60 and NMOS transistor 62. Transistors 60 and 62 are coupled together between Vcc and ground and share a common drain connection to I/O pin 30. Driver circuit 54 includes PMOS transistor 64 and NMOS transistor 66 which are also coupled together between Vcc and ground and which are also coupled to I/O pin 30 at a common drain connection.

In this embodiment control unit 56 receives three inputs: a data input signal IN, an output enable signal $\overline{OE}$ (active low), and an output driver disable (or control) signal OBDS. Each of these signals may be received from circuitry within an SRAM which includes output driver 50 or, in some embodiments, signal OBDS may be received from an external source, e.g., through a pin connection to the SRAM. In general, data signal IN will be produced by read path circuitry within the SRAM. Signal $\overline{OE}$ may be generated by timing and/or control circuitry within the SRAM and will be produced to achieve the functionality described below.

Control unit 56 includes NAND gate 70 and NOR gate 72 which receive the data input signal IN and the output enable signal $\overline{OE}$. Note that output enable signal $\overline{OE}$ is inverted by inverter 74 before being applied to the input of NAND gate 70. Output signals from NAND gate 70 and NOR gate 72 are applied to passgates 76 and 78, respectively.

Passgates 76 and 78 are under the control of output driver disable signal OBDS. When OBDS is a logic low, passgates 76 and 78 are open, allowing the output signals from NAND gate 70 and NOR gate 72 to pass. When OBDS is a logic high, passgates 76 and 78 are closed, preventing such signals from passing.

Control unit 56 further includes optional resistors 80–86 and transistors 90 and 92. Resistor 80 is coupled between the output of NAND gate 70 and the gate of transistor 60. Resistor 82 is coupled between passgate 76 and the gate of transistor 64. Resistor 84 is coupled between the passgate 78 and the gate of transistor 66. Resistor 86 is coupled between the output of NOR gate 72 and the gate of transistor 62. Thus, each resistor 80–86 is coupled within a control path to bus hold circuit 52 or driver unit 54. PMOS transistor 90 is coupled between Vcc and the gate of transistor 64 and is gated by a signal which is the logic complement of signal OBDS (produced by inverter 94). Transistor 92 is coupled between ground and the gate of transistor 66 and is gated by signal OBDS.

In operation, e.g., during a READ operation, output buffer 50 is activated by output enable signal $\overline{OE}$ (low) and a data signal IN is to be applied to I/O pin 30. Initially, signal OBDS is logic low, thus both driver unit 54 and bus hold circuit 52 drive I/O pin 30. Toggling OBDS from a logic low to a logic high causes output buffer 50 to change from a high current drive state to a low current drive state. This is because when signal OBDS transitions to a logic high, transistors 64 and 66 of driver circuit 54 are turned off, leaving only transistors 60 and 62 of bus hold circuit 52 to drive I/O pin 30. Transistors 60 and 62 are smaller than transistors 64 and 66 and, thus, source or sink only a minimal amount of current to/from I/O pin 30 to hold I/O pin 30 at a desired logic level. Signal OBDS may be toggled asynchronously, before a data contention condition develops between the SRAM containing output buffer 50 and an external device. This allows output buffer 50 to limit the current flow to I/O pad 30 as described above. Output driver 50 may be placed in a 3-stated condition at the end of the READ cycle by toggling signal $\overline{OE}$ to a logic high.

Figure 9:
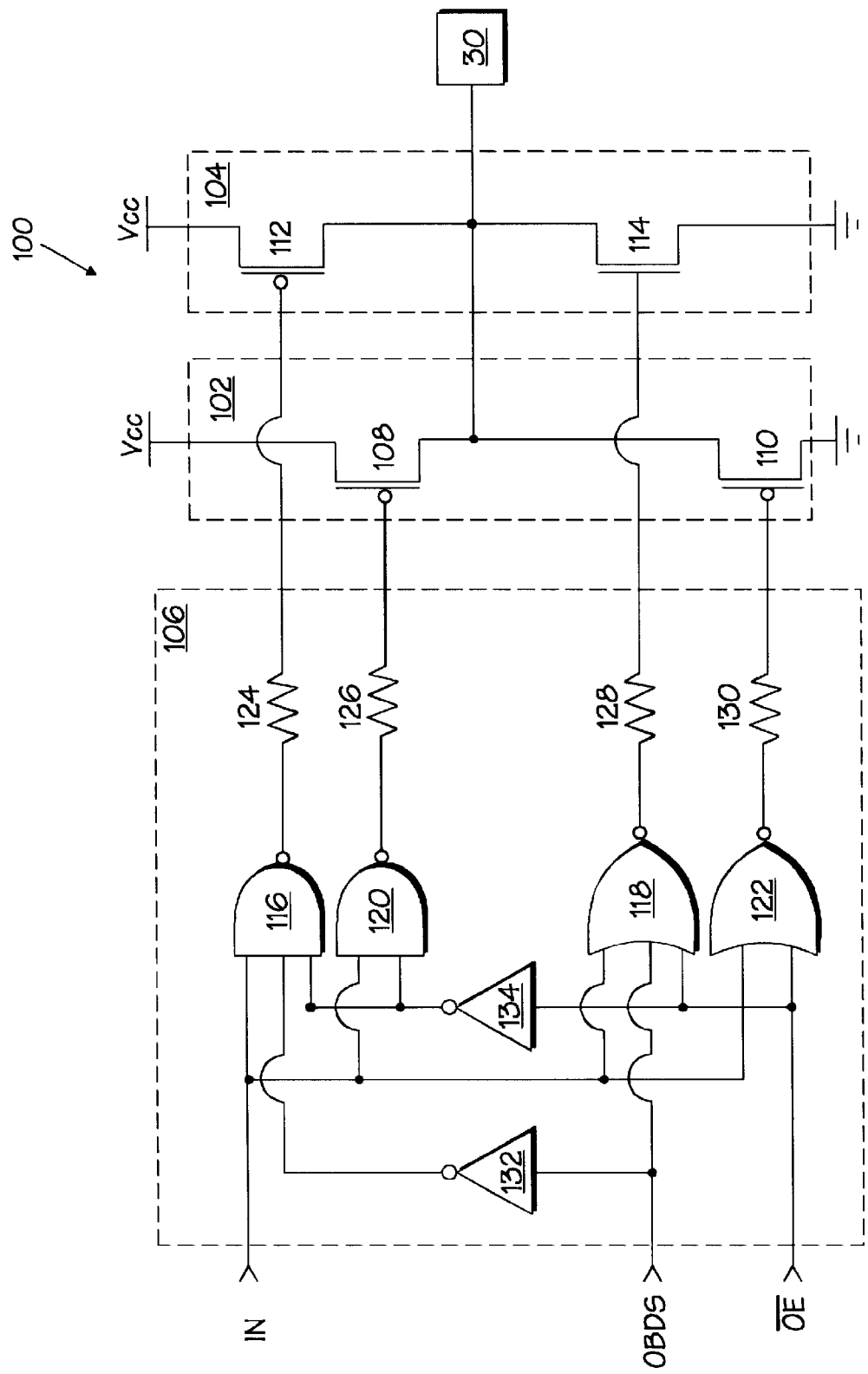
FIG. 9 illustrates an alternative embodiment of a control unit for use with an output driver in accordance with the present invention.

FIG. 9 illustrates yet a further embodiment of the present invention. In this example, an output driver 100 includes bus hold circuit 102, driver circuit 104 and control unit 106. Bus hold circuit 102 includes PMOS transistor 108 and NMOS transistor 110 which are coupled together between Vcc and ground and which share a common drain connection to I/O pin 30. Driver circuit 104 includes PMOS transistor 112 and NMOS transistor 114 which are also coupled together between Vcc and ground and which also share a common drain connection to I/O pin 30.

As in FIG. 8, control unit 106 receives three inputs; data signal IN, output enable signal $\overline{OE}$ and output driver disable signal OBDS. Each of these signals are provided to three input NAND gate 116 and three input NOR gate 118 while signals IN and $\overline{OE}$ are provided to NAND gate 120 and NOR gate 122. The outputs of NAND gates 116 and 120 and the outputs of NOR gates 118 and 122 are each used as control inputs to the gates of transistors 112, 108, 114 and 110, respectively. These control inputs may be provided through optional resistors 124–130. Note that inverters 132 and 134 are provided in the input paths to NAND gates 116 and 134 for signals OBDS and $\overline{\text{OE}}$, respectively.

In operation, data signal IN is applied to the input of output buffer 100, e.g., during a READ cycle where output buffer 100 is part of an SRAM. In conjunction with data signal IN, output enable signal $\overline{\text{OE}}$ is activated (low) and signal OBDS is pulsed low. This causes transistors of both driver circuit 104 and bus hold circuit 102 to be activated (which transistor is activated will depend on whether signal IN is a logic 1 or 0). Thus, I/O pin 30 is driven quickly to the desired logic level, according to signal IN.

Prior to the end of the READ cycle, and after I/O pin 30 has reached the desired logic level, signal OBDS may be toggled from a logic low to a logic high, thus turning off the transistors of driver circuit 104. Thus, the logic level of I/O pin 30 will be maintained only by the relatively small transistors 108 and 110 (as compared to transistors 112 and 114) of bus hold circuit 102. This is a low current drive state which will help to reduce contention situations as discussed above.

Although the present invention has been described in terms of preferred embodiments, it will be appreciated that various modifications and alterations might be made by persons skilled in the art without departing from the spirit and scope of the invention. For example, bus hold circuit 20 may be configured to include other circuit elements in order to produce a low current driver. Therefore, the foregoing discussion should be regarded as illustrative only and the invention measured only in terms of the claims which follow.

What is claimed is:

1. A Static Random Access Memory (SRAM) comprising:
   an input/output pin; and
   driver means coupled to the input/output pin and configured to drive the input/output pin to a voltage potential using a first current, and further configured to (a) hold the input/output pin at approximately the voltage potential using a second current and (b) deactivate the first current after the input/output pin is at approximately the voltage potential.

2. The SRAM of claim 1 wherein the driver means further comprises:
   a driver unit for driving the input/output pin to the voltage potential;
   a bus hold circuit for holding the input/output pin at approximately the voltage potential; and
   a control unit coupled to the driver unit and the bus hold circuit, the control unit for activating and deactivating the driver unit and the bus hold circuit.

3. The SRAM of claim 2 wherein the driver means uses the first current when the control unit activates the driver unit, and wherein the driver means uses the second current when the bus hold circuit holds the input/output pin at approximately the voltage potential.

4. The SRAM of claim 2 wherein the driver means uses the first current when the control unit activates the driver unit and the bus hold circuit, and wherein the driver means uses the second current when the bus hold circuit holds the input/output pin at approximately the voltage potential.

5. The SRAM of claim 2 wherein the driver unit further comprises a first pair of series-coupled transistors, each of the pair of series-coupled transistors having an input coupled to the control unit and having an output coupled to the input/output pin.

6. The SRAM of claim 5 wherein the bus hold circuit further comprises a second pair of series-coupled transistors having an input coupled to the control unit and an output coupled to the input/output pin.

7. The SRAM of claim 6 wherein the driver means further comprises a feedback circuit coupled between the driver means and the input/output pin and further coupled to the control unit, the feedback circuit configured to transmit a signal to the control unit once the input/output pin has reached the voltage potential, wherein the control unit deactivates the driver unit upon receiving the signal from the feedback circuit.

8. The output driver of claim 2 wherein the control unit comprises a timer configured to deactivate the driver unit after a predetermined time interval, wherein the predetermined time interval corresponds to a time needed to drive the input/output pin to the voltage potential.

9. An output driver circuit comprising:
   a driver unit for driving an input/output pin to a voltage potential using a first current;
   a bus hold circuit for holding the input/output pin at approximately the voltage potential using a second current; and
   control means coupled to the driver unit and the bus hold circuit for deactivating the driver unit after activating the bus hold circuit.

10. The output driver of claim 9 wherein the driver unit further comprises a first pair of series-coupled transistors, each of the pair of series-coupled transistors having an input coupled to the control means and having an output coupled to the input/output pin.

11. The output driver of claim 10 wherein the bus hold circuit further comprises a second pair of series-coupled transistors having an input coupled to the control unit and an output coupled to the input/output pin.

12. The output driver of claim 11 wherein the control means comprise a logic circuit configured to deactivate the driver unit in response to a control signal.

13. The output driver of claim 12 wherein the control signal is received from a pin connection.

14. A method of limiting bus contention comprising the steps of:
   driving a bus to a voltage potential using a first current provided by a driver unit;
   holding the bus at approximately the voltage potential using a second current provided by a bus hold circuit after the bus has reached the voltage potential; and
   deactivating the driver unit after activating the bus hold circuit.

15. The method of claim 14 wherein the bus is driven to the voltage potential and held at approximately the voltage potential with a driver logic block.

16. The method of claim 15 wherein the driver logic block comprises:
   the driver unit;
   the bus hold circuit; and
   a control unit.

17. The method of claim 16 wherein the step of driving the bus to the voltage potential using a first current further comprises the step of activating the driver unit and the bus hold circuit.

18. The method of claim 17 wherein the step of deactivating the driver unit is controlled by the control unit in response to a control signal.

19. The method of claim 18 wherein the control signal is developed externally to the driver logic block.

* * * * *